(12) United States Patent
Dhaene et al.

(10) Patent No.: US 6,295,635 B1
(45) Date of Patent: Sep. 25, 2001

(54) ADAPTIVE MULTIDIMENSIONAL MODEL FOR GENERAL ELECTRICAL INTERCONNECTION STRUCTURES BY OPTIMIZING ORTHOGONAL EXPANSION PARAMETERS

(75) Inventors: Tom Dhaene, Deinze; Jan De Geest, Wetteren, both of (BE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/193,296

(22) Filed: Nov. 17, 1998

(51) Int. Cl.$^7$ ..................................................... G06F 17/50
(52) U.S. Cl. .............................................................. 716/14
(58) Field of Search ................................. 703/14; 713/14; 716/1–18

(56) References Cited

U.S. PATENT DOCUMENTS 6,088,523 * 7/2000 Nabors .................................. 703/14

* cited by examiner

*Primary Examiner*—Matthew S. Smith
*Assistant Examiner*—Thuan Do

(57) ABSTRACT

A method for modeling a general passive interconnection structure for use in a circuit simulator. The model is based on full-wave EM simulations and has a predefined accuracy when compared to the full-wave EM simulator. The interconnection structure is described by parameters that depend on geometric parameters determined by a vector x and the frequency of the signal passing through the interconnect circuit. In a CAD system according to the present invention, information representing a plurality of coefficients, $C_m(f)$ is stored in the CAD system for m=0 to M. The CAD system also stores information specifying the values of a plurality of multinomial functions, $P_m(x)$ for m=0 to M, wherein M>1. When the CAD system needs the value of one of the parameters that describes the interconnect circuit, the CAD system computes an approximation, M(f,x), to that parameter according to the relationship:

$$M(f, x) = \sum_{m=0}^{M} C_m(f) P_m(x).$$

wherein each $P_m(x)$ is a multinomial for m>0. The algorithm combines three adaptive loops. The first adaptive loop selects the required data points by evaluating a number of selection criteria. The number of data points needed to achieve the desired accuracy for the model is minimized. The selected scattering parameters at the data points are calculated using, the full-wave EM simulator. The second adaptive loop selects the frequency points needed by the simulator to accurately model the behavior of the scattering parameters over the whole frequency range. The third adaptive loop selects the number of polynomials needed to accurately model the data points. The resulting model has a predefined accuracy when compared to full-wave EM simulations.

8 Claims, 2 Drawing Sheets

ADAPTIVE MULTIDIMENSIONAL MODEL FOR GENERAL ELECTRICAL INTERCONNECTION STRUCTURES BY OPTIMIZING ORTHOGONAL EXPANSION PARAMETERS

FIELD OF THE INVENTION

The present invention relates to circuit simulators, and more particularly, to a circuit modeling method for high frequency interconnect structures that is better adapted for use in circuit simulators and CAD tools for design and optimization purposes.

BACKGROUND OF THE INVENTION

Integrated circuits for use at high frequencies often include high frequency interconnections such as coupled transmission lines, junctions, spirals, etc. Precise characterization of such high-frequency interconnections is very important for circuit simulation and optimization purposes.

Various numerical full-wave electro-magnetic (EM) analysis techniques have been used to characterize these interconnect structures. Solutions to the characterization problem based on solving, Maxwell's equations using the method of moments, finite elements, and finite difference time domain methods have all been utilized. While these numerical techniques are very accurate, they require large amounts of computer time. It might, for example, take days to optimize a simple microstrip stub filter consisting of only a handful of transmissions lines, tees and open ends. As a result, these techniques are not suitable for direct use in CAD software for simulation and optimization of integrated circuits containing such circuit elements.

One method for avoiding the high computer workload of EM simulations in the CAD software is to compute a model of a circuit element based on a large number of EM simulations. This model is then used to compute the relevant circuit parameters during the CAD simulation and optimization. In the simplest approach, look-up tables are used to access data computed by the EM analysis software representing a circuit element having various dimensions. This model is then utilized during, the CAD simulation. The circuit representation (scattering, parameters or transmission line parameters) of a circuit or sub-circuit is calculated prior to the CAD simulation on a fixed grid of samples in the parameter space (discrete width, height, angle, spacing . . . ) at some discrete frequencies, and the data is stored in a database. An approximate model is then computed during the CAD simulation by interpolation of the results stored in the database.

Using some form of simple curve fitting can augment the simple look-up table approach. In these systems, the dimension of the parameter space is often limited to 1. The commonly used fitting, functions include polynomials, rational functions and trigonometric functions.

Another prior art modeling technique uses Artificial Neural Networks (ANN's) to generate parameterized models. In these systems, a number of training and testing samples are randomly chosen in the parameter space and along the frequency axis, and an ANN is trained to model the circuit behavior.

The modeling techniques described above all have some important limitations. Look-up table systems without interpolation are limited to the set of precalculated structures. Such systems seldom have sufficient data to optimize a design.

Systems that utilize interpolation or curve fitting allow the designer to specify arbitrary model parameters within the boundaries of the model. However, the accuracy and efficiency of these techniques is often questionable. Some parts of the parameter and frequency space will, in general, be oversampled, while other parts are undersampled. Oversampling wastes computational resources, while undersampling leads to a poor correlation between the model and circuit performance. In addition, the disk space required for multidimensional table-based models can be quite high.

Interpolation systems and curve fitting systems cannot guarantee a predetermined level of accuracy. Furthermore, curve-fitting techniques often have artifacts. In addition, these techniques have difficulty modeling, the frequency behavior of resonant structures.

Techniques based on artificial neural networks can provide compact high-dimensional and highly non-linear models that overcome many of these problems. However, these techniques also have some serious drawbacks. There is no a priori method for defining a suitable net topology for an arbitrary circuit element. The number of hidden layers and nodes must be found by trial and error. In addition, frequency behavior is difficult to model. Once the user has decided on a particular ANN structure, there are long, training times. Finally, there is no easy method for determining, the accuracy of the resulting model.

Broadly, it is the object of the present invention to provide an improved method for generating, models for passive interconnect structures for use in circuit simulators.

It is a further object of the present invention to provide a method that automatically determines the data points and the number of degrees of freedom needed to model the structure with a predefined accuracy.

These and other objects of the present invention will become apparent to those skilled in the art from the following detailed description of the invention and the accompanying drawings.

SUMMARY OF THE INVENTION

The present invention is a method for building a model, based on full-wave EM simulations, for the scattering parameters of a general passive interconnection structure for use in a circuit simulator. The resulting model has a guaranteed predefined accuracy compared to the full-wave EM simulator. The algorithm combines three adaptive loops: adaptive data point selection in the parameter space, adaptive frequency point selection along the frequency axis and adaptive selection of the model complexity. The interconnection structure is described by parameters that depend on geometric parameters determined by a vector x and the frequency of the signal passing through the interconnection. In a CAD system according to the present invention, information representing a plurality of coefficients, $C_m(f)$ is stored in the CAD system for m=0 to M. The CAD system also stores information specifying the values of a plurality of multinomial functions, $P_m(x)$ for m=0 to M. When the CAD system needs the value of one of the scattering parameters that describe the interconnect circuit, the CAD system computes an approximation, $M(f,x)$, to that parameter according to the relationship:

$$M(f, x) = \sum_{m=0}^{M} C_m(f)P_m(x).$$

wherein each $P_m(x)$ is preferably a multinomial. In the preferred embodiment of the present invention, the set of functions $P_m(x)$ is an orthonormal set. The data points are selected by evaluating a number of error criteria.

DETAILED DESCRIPTION OF THE INVENTION

Figure 1:
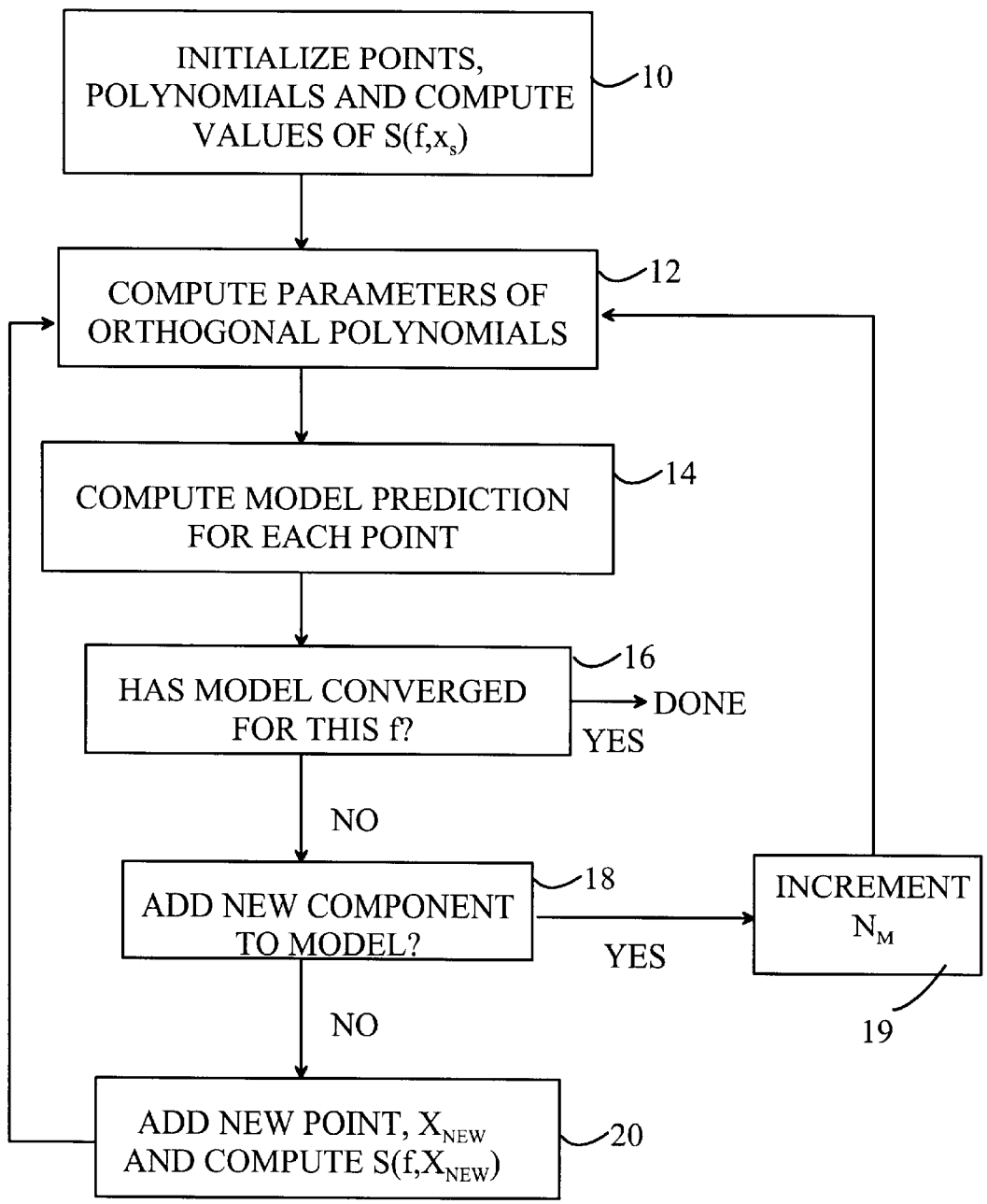
FIG. 1 is a flow chart of the method by which the present invention determines the model parameters in those cases in which the circuit element depends on only one geometric parameter.

Consider a general passive RF or microwave interconnection structure. At any given frequency, f, this structure can be characterized by a set of measurable parameters such as the scattering parameters (S-parameters) or transmission line parameters of the structure. For example, a general time-invariant interconnection structure that interconnects N ports can be characterized by a scattering matrix which is an N×N complex valued matrix. If the structure is reciprocal this matrix has N(N+1)/2 relevant parameters. Given the physical dimensions of the interconnect, full-wave EM analysis routines such as the HP-MOMENTUM program can compute these parameters for any given frequency or set of frequencies.

Similarly, (coupled) transmission lines may be characterized by their length, the characteristic impedance matrix, and the voltage propagation matrix. These matrices are N×N matrices, where N is the number of conductors in the transmission line.

In general, the circuit parameters that characterize an interconnect structure are each a function of frequency and certain geometric parameters. The geometric parameters can be related to the dimensions of the metalized elements in the circuit, e.g., the widths, lengths, or other physical dimensions of the conducting strips. In addition, the geometric parameters may also include parameters related to the substrate such as the dielectric properties of the substrate and the substrate dimensions. These geometric variables together with the frequency define a parameter space. The parameter space is, in general, bounded. Within these bounds, the goal of a model is to return the values of the measurable parameters, with a certain predefined accuracy when compared to full-wave EM simulations, given the values for the frequency and geometric parameters.

In the following, discussion, it will be assumed that the geometrical portion of the parameter space is normalized such that each geometrical parameter has a range of 0 to 1. Given a different range for the geometric parameters, i.e., a parameter x running from a to b, it is always possible to define a new set of geometric parameters in which the corresponding parameter runs from 0 to 1 by a simple change of variable.

To simplify the notation used to describe the present invention, vector quantities will be denoted in bold face type. The present invention builds a model of a circuit component by expanding each of the relevant measured variables S as a function of the form:

$$S(f, x) \approx M(f, x) = \sum_{m=0}^{M} C_m(f)P_m(x) \quad (1)$$

Here, M(f, x) is the model's value for the circuit parameter S for frequency f and physical parameters x. The model utilized in the present invention approximates S by an expansion in an orthonormal set of multidimensional polynomials (although any other complete set of basis functions can be used as well) that depend on the physical parameters. The frequency dependence is taken into account by utilizing weights, $C_m$, that depend on the frequency, but not on the physical parameters. Similarly, the multinomials, $P_m$, depend only on the physical parameters.

The preferred orthonormal multinomials, are the Generalized Forsythe multinomials. These multinomials are preferred because they provide improved numerical stability and computational efficiency. These multinomials are the multidimensional generalization of the (1-dimensional) Forsythe polynomials known in the data fitting arts. The reader is directed to F. E. Forsythe, "Generation and use of Orthogonal Polynomials for Data Fitting with a Digital Computer", Journal of Industrial Society of Applied Mathematics, 5, pp. 74–88(197) for a more complete discussion of these functions.

These multinomials are orthonormal in the sample points, i.e., $$\sum_{s=samples} P_i(x_s) \cdot P_j(x_s) = \delta_{i,j} \quad (2)$$

where $\delta_{ij}$ is the conventional Dirac delta function and the $x_s$, for s=1 to $N_s$, are the sample points for which values of S(f,x) are known (through simulation with HP-MOMENTUM).

Since the multinomials are orthonormal, only a limited number of simple multiplications and additions are required to determine the weighting functions $C_m(f)$ at any given frequency once the known values, $S(f,x_s)$ for the parameter are obtained either from measurements or simulation on an EM simulator, i.e., $$C_m(f) = \sum_{s=samples} S(f, x_s)P_m(x_s) \quad (3)$$

In the preferred embodiment of the present invention, a set of frequencies $f_j$ for j=1 to $N_f$ are defined together with a set of sample points $x_s$. For each of the frequencies and sample points, the relevant circuit parameters are computed using an EM analyzer and the data is fit to a multinomial.

In constructing a model according to Eq(1), the set of sample points and the order of the expansion must be specified. As noted above, if the number of sample points is set too high, the model will be wasteful of both computational and storage resources. In the preferred embodiment of the present invention, the order of the model is set first, provided there are sufficient data points in the set of parameters at each frequency. To set the order of the expansion, a first error bound, $\Delta_M$ is utilized (where $\Delta_M$ is related to the desired accuracy $\Delta$). Additional multinomials are added to the expansion until the difference between the EM analyzer results and the model prediction is less than this error bound for each $f_j$ (j=1, ..., $N_f$) and each $x_s$ (s=1, ..., $N_s$). Once the order is set and the data points defined such that the maximum discrepancy at each f is less than $\Delta_M$, the frequency dependent weights are modeled to further compact the amount of data that must be stored.

The manner in which the model parameters are generated will now be explained in more detail with the aid of FIG. 1, which is a flow chart for the model building process in the case in which there is only one geometrical parameter. In this case, the model at each frequency reduces to $$M(f, x) = \sum_m C_m(f) P_m(x) \quad (4)$$
$$= \sum_m C_m(f) \sum_{p=0}^{m} \beta_{mp} x^p$$
$$= \sum_m C'_m(f) x^m$$

where x is the normalized geometrical parameter. A flow chart of the adaptive algorithm for determining the sample points $x_s$ and the maximum order for the model is shown in FIG. 1. The goal of the model parameterization is to provide a representation of the measurable parameters over the frequency and parameter ranges, with a predefined accuracy and using the fewest possible data points.

The polynomials in Eq(4) only depend on the geometrical parameters. Given a set of data points $x_s$, these polynomials are calculated as follows. To minimize the computational load of computing the coefficients, $C_m(f)$, the $\beta_{mp}$ are chosen such that the polynomials $$P_m(x) = \sum_{p=0}^{m} \beta_{mp} x^p \quad (5)$$

are orthonormal on the sample set, i.e., $$\sum_{s=1}^{N_s} P_k(x_s) P_l(x_s) = \delta_{kl} \quad (6)$$

The use of orthonormal polynomials also improves the numerical stability of the modeling algorithm.

A flowchart of the method of the present invention as applied in the one-dimensional case is shown in FIG. 1. A separate model is computed for each measurable parameter in the circuit element. To simplify the following discussion, only one of the scattering parameters will be referenced; however, it is to be understood that the modeling, process described below is repeated for each of the circuit parameters needed by the CAD program in which the model is to be inserted.

To simplify the notation in the following discussion, the set of sampling frequencies will be denoted by $\Phi$. Building the models is repeated for each f in $\Phi$. The results for the various f values are then combined as discussed below. When a new data point is selected the models for each of the scattering parameters at each of the frequencies in $\Phi$ are considered.

An initial set of three sampling, points and initial polynomial order are chosen as shown at 10. The initial sampling distribution consists of 3 points: the two boundaries and the center of the interval in x. The initial polynomial order can be set to one. The scattering parameter values $S(f, x_s)$ are computed for each of the initial sampling points using an EM analyzer routine.

Each time the sample set $\{x_s\}$ is updated, or the highest polynomial order is increased, the polynomial coefficients, $\beta_{mp}$, must be updated as shown at 12 so that the polynomials are orthogonal on the new sample set. Once the polynomial coefficients are known, the $C_m(f)$ are computed as shown at 14, i.e., $$C_m(f) = \sum_{s=samples} S(f, x_s) P_m(x_s) \quad (7)$$

for m=0 to $N_M-1$, where $N_M$ is the number of terms in Eq. (4). The $C_m(f)$ are then used to generate the modeled values, $M(f, x_s)$, for the scattering parameter at each of the sampling points, $x_s$. The modeled values are then tested against the EM analyzer values to determine if the model has converged for this frequency as shown at 16. If the model has converged, the process will be repeated for the next f in $\Phi$ until all of the f values have been modeled.

The model has converged if $$|S(f, x_s) - M(f, x_s)| \leq \Delta_M \quad (8)$$

for all $x_s$. If Eq(8) is not satisfied for all the data points and for each f in $\Phi$, then a new component is added to the model, i.e., $N_M \rightarrow N_M+1$, as shown at 19, and the procedure repeated starting at 12. When the models for every f in $\Phi$ have converged, the adaptive sample selection routine selects a new data point, $x_{new}$, as shown at 20 and the scattering parameter $S(f, x_{new})$ is computed for this point using the EM analyzer. This data is added to the database, and the modeling, procedure is repeated starting at 12.

As noted above, a model is built for each f in $\Phi$ and for each of the relevant circuit parameters. In other words, for each of the scattering parameters, there are a number of different models, one for every frequency in $\Phi$. The number of polynomials used in each of these models, $N_{Mj}$ for $f_j$ will, in general, be different at the different frequencies. In the preferred embodiment of the present invention, the various individual models are combined to generate a single model that covers the whole frequency range. The maximum number of polynomials used at any of the frequencies in $\Phi$ is used as the number of polynomials in the global model: $N_M = \max(N_{M1}, N_{M2}, \ldots, N_{M\Phi})$. The coefficients are then extended to frequency values other than the discrete values used in the model by polynomial or rational fitting techniques which allow the values of $C_m(f)$ to be computed at any intermediate frequency within $[f_L, f_H]$. It should be noted that these fitting techniques also provide a more compact form for storing coefficients, $C_m(f)$, since data is not needed at all frequencies for regions of the frequency space in which the coefficients vary slowly as a function of frequency.

Having explained the manner in which the modeling is performed in the case in which only one geometric parameter is used, the manner in which a model covering a multidimensional geometric parameter space is generated will now be explained. A multidimensional polynomial model can in general be written as $$M(f, x) = \sum_m C_m(f) \sum_{p=0}^{m} \beta_{mp} \prod_n x_n^{e_{mpn}} = \sum_m C'_m(f) \prod_n x_n^{e_{mn}} \quad (9)$$

where, $X = [x_1, \ldots, x_n] \in R_N = \{[0-1], i=1, \ldots, n\}$ and $f \subset [f_L, f_H]$.

When building a multidimensional model there are two issues that are essentially different from the one-dimensional case: the manner in which the initial sample point distribution is generated and the manner in which the model is gradually expanded to achieve the desired accuracy in the sample points. In both cases, the influence of each of the geometrical parameters on the circuit parameters must be considered. Therefore, prior to building, the multidimensional model, for each of the geometrical parameters, $x_i$, a one-dimensional model is built using the method described above. In this model, $x_i$ varies over the whole range [0,1], while the other parameters $x_k$ are kept constant: $x_k=0.5$ (for $i \neq k$). The number of data points and the number of polynomials used for building these one-dimensional models are denoted by $N_{si}$ and $N_{Mi}$ respectively (with i=1, . . . , n ).

The initial multidimensional sample distribution is generated by taking, $N_{ai}$ uniformly distributed points along each $x_i$-axis in the parameter space $R_N$, where $N_{ai}$ is related to $N_{si}$. In this way the geometrical parameters that have the most influence on the scattering parameters are sampled most densely.

For structures with two or more geometrical parameters there is more than one way to expand the models. A model can be expanded by adding a new component generated by increasing the degree of any one of the parameters. The final model must reflect the influence each of the parameters has on the circuit parameters. In general a new component can be written as $$T_l = X_1^{e_{l1}} X_2^{e_{l2}} \ldots X_n^{e_{ln}} = \{e_{l1}, e_{l2}, \ldots, e_{ln}\} \quad (10)$$

The exponents $e_i$ are normalized:

$$e_i \to E_i = e_i \prod_{i \neq k} N_{Mk} \quad (11)$$

When selecting a new component the following rules apply:
1. From all possible new components retain the components $T_l$ for which $E_{tm}=\max \{E_{t1}, E_{t2} \ldots , E_{tm}\}$ is minimal.
2. From the remaining components retain those for which $S_i = E_{t1} + E_{t2} + \ldots + E_{tm}$ is minimal.
3. From the remaining components retain those for which $e_{tm} = \max \{e_{t1}, e_{t2}, \ldots, e_{tm}\}$ is minimal.
4. From the remaining components retain those for which $S_i = e_{t1} + e_{t2} + \ldots e_{tm}$ is minimal
5. From the remaining components select one as the new component.

The process of selecting a new component only depends on the location of the sample points in the geometrical parameter space and on the components that are already used. It is independent of the frequency and of the value of the scattering parameters in the sample points. Therefore, for each of the modeled scattering parameters and for every $f_j \in \Phi$, there is one common set of components (and hence, one common set of multinomials). Only the number of components can be different for the different frequencies and for the different scattering parameters.

Figure 2:
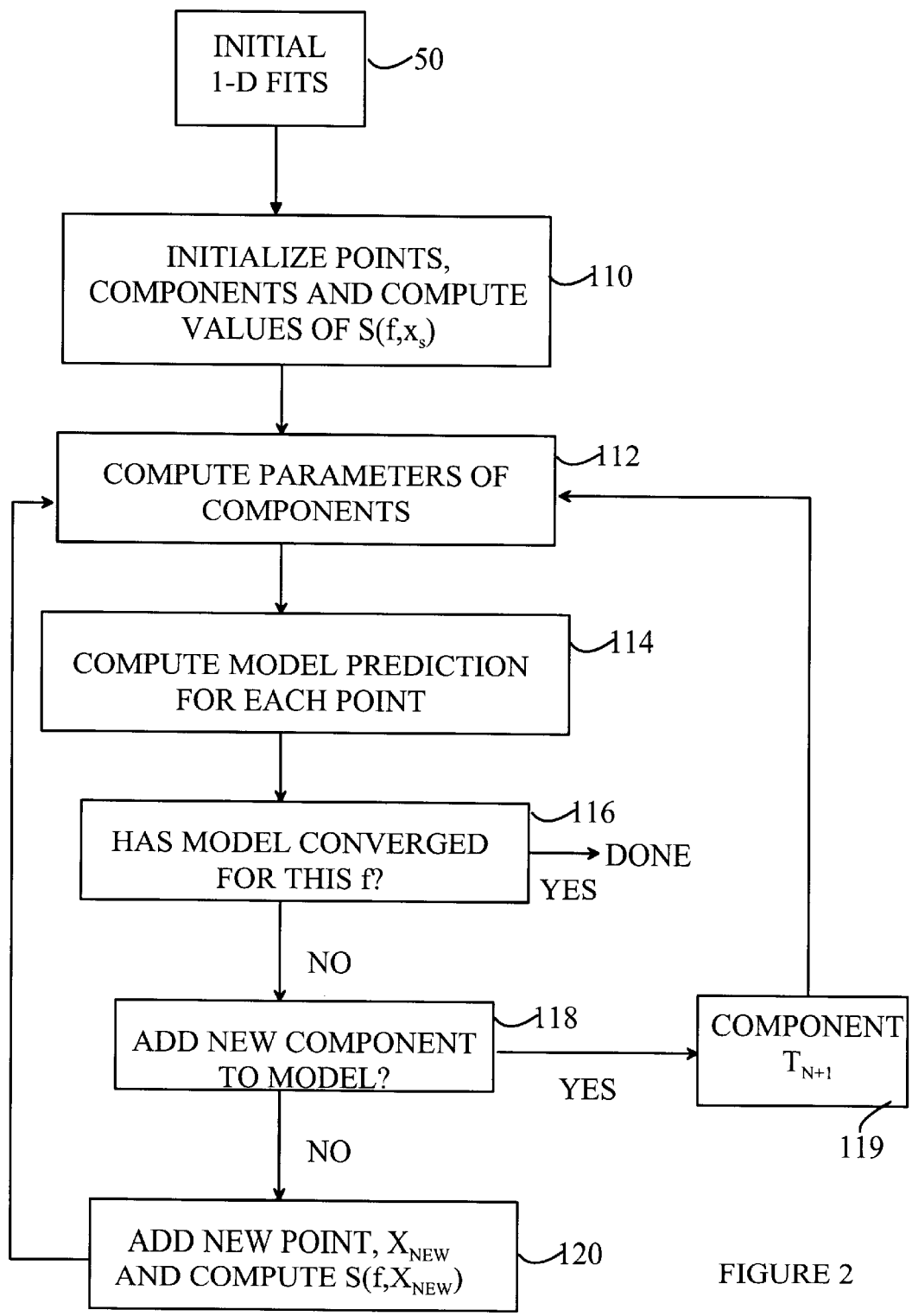
FIG. 2 is a flow chart of the method by which the present invention determines the model parameters in those cases in which the circuit element depends on more than one geometric parameter.

Refer now to FIG. 2, which is a flow chart of the multidimensional algorithm. With the exception of selecting the initial points and components as shown at 50, the rest of the multidimensional algorithm is analogous to the one-dimensional algorithm. To simplify the discussion, blocks that perform functions analogous to those performed by blocks in FIG. 1 have been given numbers that differ from those in FIG. 1 by 100 and will not be discussed in detail here. Once the model order and initial sample points have been selected, the algorithm proceeds in the same manner as the algorithm shown in FIG. 1. For any given set of points, the modeled and computed parameters are compared. A new component is added using the rules discussed above if the model has not yet converged. If the model has converged the adaptive sample selection routine selects a new sample point.

Selecting, a new data point is done by evaluating a number of selection criteria. If all the selection criteria are satisfied the algorithm converges. If not, a new data point is selected where the criteria are violated the most. These criteria are based on the current state of the models. Since there are separate models for each of the frequencies in $\Phi$, the criteria must be checked for every frequency in $\Phi$. Evaluating the selection criteria can be very time consuming, so it is important to perform as few unnecessary evaluations as possible. Every time a criterion is evaluated, and it evaluates to TRUE (i.e. no new data point is selected), the evaluation was unnecesary. Accordingly, the criteria are evaluated first at the frequencies that are most likely to result in a new data point.

To aid in this evaluation, the preferred embodiment of the present invention keeps track of how many times each frequency $f_j \in \Phi$ was responsible for the selection of a new data point. This information is stored in a variable $N_{hj}$ that is maintained for each frequency. The frequencies, $f_j$ in $\Phi$ are sorted in a descending order according to their corresponding $N_{hj}$. If two frequencies $f_j$ and $f_k$ have the same $N_{hj}=N_{hk}$, then the highest frequency comes first, because often the circuit parameters have the most complex behavior at the highest frequencies. The frequencies that were the most responsible for new data points in the past are checked first.

The process of selecting data points and building models in an adaptive way is often called exploration. Exploration aims at reducing the modeling error of a model as quickly as possible by choosing appropriate new data points. If exploration depends on the current state of the model, it is termed reflective. Reflective exploration is useful when the process that provides the data is very costly. This is certainly the case for full-wave electromagnetic simulators. Non-statistical reflective exploration requires reflective functions, which are used to select a new data point. These reflective functions adapt as the model adapts. The reflective function used in the present invention algorithm is the difference between the 'best fit' $M_H$, this is the current model, and the "second best fit" $M_L$:

$$M_H(f, X) = \sum_{m=0}^{N_M-1} C_m(f) P_m(X) \quad (12)$$

$$M_L(f, X) = \sum_{m=0}^{N_M-2} C_m(f) P_m(X) \quad (13)$$

The new data point is selected near the maximum of the reflective function:

$$\max_{X \in R, f \in \Phi} |M_H(f, X) - M_L(f, X)| = \max_{X \in R, f \in \Phi} |C_{N_M-1}(f) P_{N_M-1}(X)| \quad (14)$$

The algorithm converges when $$\max_{X \in R, f \in \Phi} |C_{N_M-1}(f) P_{N_M-1}(x)| \leq \Delta \quad (15)$$

where $\Delta$ is the desired accuracy of the model.

If one of the scattering parameters $S_{ij}$ has a local minimum or maximum in the parameter space it is important to have a data point in the close vicinity. If there is no data point near this extreme, it will be difficult to get a good approximation of the value of the scattering parameter at the extreme. Therefore, if $X_m \subset R_N$ denotes a local maximum or minimum of a model, M(f,x), then it is advantageous to have a data point x, in the close vicinity of $x_m$, that is, there is a sample point $x_s$ for which $$|X_m - X_s| < \Delta_s \quad (16)$$

where $\Delta_s$ is the maximum sample distance in the parameter input space. If there is no data point in the close vicinity of $x_m$, then the preferred embodiment of the present invention chooses $x_m$ as a new data point. If it is known that the structure has a resonant behavior with respect to x at $x_m$, a sample should be placed at $x_m$ if Eq. (16) is not satisfied.

As mentioned above, the scattering parameters of a linear, time-invariant, passive circuit satisfy certain physical conditions. These conditions can be used to check the accuracy of the models. If the models fail the physical conditions, they cannot accurately model the scattering parameters. Taking, into account the desired accuracy $\Delta$ of the models, the following conditions must hold for all frequencies over the current sampling points:

$$|S_{ij}|^2 \leq 1 + 2\Delta\sqrt{2}, \text{ for } 1 \leq i,j \leq N_p \text{ and } i \leq j \quad (17)$$

and $$\sum_{j=1}^{N_p} |S_{ij}|^2 \leq 1 + 2\Delta\sqrt{2N_p}, \text{ for } 1 \leq i \leq N_p \quad (18)$$

These physical conditions act as additional reflective functions. That is, if they are not satisfied, a new data point is chosen where the criteria are violated the most.

Density based exploration aims at making, the set of sample points uniformly distributed in the input space. This is based on the fact that the modeling errors tend to be bigger in regions having fewer data points. After all the models have converged, a number of additional data points can be selected in those parts of the parameter space that are the least densely sampled. These extra sample points can be used as testing, points for the models. Each testing point is simulated using an EM simulator and the current model. If the modeling error in a test point is larger than a predetermined value, the test point is used as a new data point and the model is recomputed.

The above-described embodiments of the present invention assume that the parameter space is a multidimensional rectangular region and all geometrical parameters are independently variable. However, in particular structures, there exist certain relationships between two or more of the geometrical parameters in which the degree to which those parameters can be independently varied. These relationships limit the possible variations of the geometrical parameters. Such relationships alter the manner in which the initial multidimensional sample distribution is generated. Because the one-dimensional models are used to gain insight in the effect each of the geometrical parameters have on the modeled data, it is important that these models cover as much as possible of the parameter range. In the preferred embodiment of the present invention, the initial two-dimensional sample distribution consists of all the points in the valid part of the parameter space, including those for the one-dimensional models and of course, the ones on the border of the parameter. Furthermore, when selecting, a new data point the reflective functions are evaluated only in the valid part of the parameter space.

The modeling error of any model depends on the ability of the basis functions to represent the data. For highly non-linear data or when there are discontinuities in the data, polynomials have difficulties modeling the data accurately without resorting to polynomials of very high degree, and the algorithm can fail to converge. Furthermore, numerical problems may occur when the degree of the multinomials becomes too high. Hence, it is advantageous to limit the degree of the multinomials.

One method for limiting the degree of the multinomials is to use two or more piecewise polynomial models. In the preferred embodiment of the present invention, when the algorithm falls to converge after a certain number of steps, the parameter space is subdivided into two subspaces. The decision to subdivide the parameter space can be based on a number of criteria (which are sometimes related to each other):

1. The degree of the multinomials becomes too high.
2. The number of data points becomes too large.
3. High non-linearities (or important numerical noise) are detected.

After subdividing the parameter space, the resulting subspaces are treated separately. Electrically large structures or resonant structures often require multiple divisions. The initial parameter space is then transformed into a patchwork of subspaces, all having their own separate models. However, the parameter space cannot be split indefinitely. The data are generated by an EM simulator which solves Maxwell's equations by discretizing the circuit under study. This discrimination, along with other sources of numerical errors (e.g. round-off errors), causes numerical noise to be superimposed on the data. If the parameter space is subdivided too many times, the model will start focussing on this numerical noise, instead of modeling the relevant data. Therefore, dividing the parameter space must be prohibited when the volume of the subspaces becomes smaller than a fraction of the original parameter space or when the numerical noise on the data becomes too important.

Two different situations can occur when splitting a one-dimensional parameter space: the number of samples $N_s$ can be either even or odd. In both cases the samples are ordered in an ascending way. If $N_s$ is odd, the parameter space is split at the middle sample. The middle sample is used twice: at the end of the left subspace, and at the beginning of the right subspace. The number of samples in both subspaces is $(N_s+1)/2$. If $N_s$ is even there are two middle samples. In the preferred embodiment of the present invention, the parameter space is split at the point that is closest to the middle of the normalized range. One subspace has $(N_s)/2$ samples, the other one $(N_s/2+1)$.

A multidimensional parameter space is preferably split by splitting, along one of the axes. Hence, the parameter space can be split in as many different ways as there are geometrical parameters. Splitting is done along the axis of the parameter that has the highest degree in the multinomials. This way the maximum degree of the multinomials is limited.

The above-described embodiments of the present invention have utilized particular methods for generating the sample points on which the model parameters are computed. However, it will be obvious to those skilled in the art from the preceding discussion that other methods for defining a sample set and solving for the model parameters may be utilized without deviating from the teachings of the present invention. The present invention utilizes a model shown in Eq. (1) in which the parameters are determined such that the discrepancy in the model predictions and the values, determined by simulation or measurement, are minimized. Any of the methods known to the mathematical arts for solving, this optimization problem can, in principle, be utilized. The methods discussed above are preferred because those methods reduce the computational time and provide checks on the accuracy of the model.

The method of the present invention is preferably practiced on a general-purpose data processing system. The resultant model is intended for running on the same platform as the CAD system into which it is inserted.

Various modifications to the present invention will become apparent to those skilled in the art from the foregoing description and accompanying drawings. Accordingly, the present invention is to be limited solely by the scope of the following claims.

What is claimed is:

1. In a method of operating a computer to provide assistance in the design and modeling of integrated circuits, one of said integrated circuits including an electrical interconnect circuit that is described by measurable parameters that depend on geometric parameters determined by a vector x, said measurable parameters further depending, on the frequency, f, of an electrical signal passing through said interconnect circuit, said computer aided design requiring a value for one of said measurable parameters, the improvement comprising:

storing information representing a plurality of coefficients that depend on f, $C_m(f)$;
storing information specifying, the values of a plurality of multinomial functions, $P_m(x)$ for m=0 to M, wherein M>1; and
computing an approximation, M(f,x), to one of said measurable parameters according to the relationship:

$$M(f, x) = \sum_{m=0}^{M} C_m(f) P_m(x).$$

wherein each $P_m(x)$ is a multinomial for m>0.

2. The method of claim 1 wherein the set of functions $P_m(x)$ are orthogononal to one another.

3. The method of claim 1 wherein said interconnect circuit comprises a time-invariant interconnection structure that interconnects N ports to one another and wherein said parameter determines one component of an N×N matrix characterizing said interconnect structure, wherein N>1.

4. The method of claim 1 wherein said interconnect structure comprises transmission lines, and wherein said parameter determines one component of an impedance matrix representing said transmission lines.

5. A method of operating a computer to provide information specifying the parameters of a model for generating a quantity describing the electrical behavior of an electrical interconnect circuit that depends on geometric parameters determined by a vector x and the frequency, f, of an electrical signal passing through said interconnect circuit, said quantity being approximated by a function M(f,x), $$M(f, x) = \sum_{m=0}^{M} C_m(f) P_m(x)$$

wherein each $P_m(x)$ is a multinomial for m>0, said method comprising the steps of:
specifying a set of sample points, $x_I$, for I=1 to $N_s$;
specifying a set of frequencies, $f_j$, for j=1 to $N_f$;
determining a value for said quantity for each combination of said frequencies and sample points utlizing an EM simulator; and
determining said coefficients, $C_m(f)$, from said determined values.

6. The method of claim 5 wherein said steps of specifying said set of sample points and specifying said set of frequencies are performed iteratively without user intervention.

7. A method of operating a computer to provide information specifying the parameters of a model for generating a quantity describing the electrical behavior of an electrical interconnect circuit that depends on geometric parameters determined by a vector x and the frequency, f, of an electrical signal passing through said interconnect circuit, said quantity being approximated by a function M(f,x), $$M(f, x) = \sum_{m=0}^{M} C_m(f) P_m(x)$$

wherein each $P_m(x)$ is a multinomial for m>0, said method comprising the steps of:
specifying a set of sample points, $x_I$, for I=1 to $N_s$;
specifying a set of frequencies, $f_j$, for j=1 to $N_f$;
determining a value for said quantity for each combination of said frequencies and sample points utilizing an EM simulator; and
determining said coefficients, $C_m(f)$, from said determined values,
wherein said steps of specifying said set of sample points and specifying said set of frequencies are performed iteratively without user intervention, and
wherein said iteration terminating when M(f,x) matches said value determined by said EM simulator for each combination of said frequencies and sample points to within a predetermined error.

8. A method of operating a computer to provide information specifying the parameters of a model for generating a quantity describing the electrical behavior of an electrical interconnect circuit that depends on geometric parameters determined by a vector x and the frequency, f, of an electrical signal passing through said interconnect circuit, said quantity being approximated by a function M(f,x), $$M(f, x) = \sum_{m=0}^{M} C_m(f)P_m(x)$$

wherein each $P_m(x)$ is a multinomial for m>0, said method comprising the steps of:
specifying a set of sample points, $x_I$, for I=1 to $N_s$;
specifying a set of frequencies, $f_j$, for J=1 to $N_f$;
determining a value for said quantity for each combination of said frequencies and sample points utilizing a EM simulator; and
determining said coefficients, $C_m(f)$, from said determined values,
wherein said steps of specifying said set of sample points and specifying said set of frequencies are performed iteratively without user intervention, and
wherein M and said multinomials are determined iteratively without use intervention.

* * * * *